United States Patent
Kashiwase et al.

(10) Patent No.: US 7,049,729 B2
(45) Date of Patent: *May 23, 2006

(54) AMPLIFIER CONVERTING CHARGE SIGNAL

(75) Inventors: Hajime Kashiwase, Tokyo (JP); Hiromichi Watanabe, Tokyo (JP); Hiroshi Yokoyama, Saitama (JP)

(73) Assignee: Fuji Jukogyo Kabushiki Kaisha, Tokyo (JP)

( * ) Notice: Subject to any disclaimer, the term of this patent is extended or adjusted under 35 U.S.C. 154(b) by 2 days.

This patent is subject to a terminal disclaimer.

(21) Appl. No.: 10/801,390

(22) Filed: Mar. 15, 2004

(65) Prior Publication Data

US 2004/0183398 A1  Sep. 23, 2004

(30) Foreign Application Priority Data

Mar. 19, 2003  (JP) .............................. 2003-076130

(51) Int. Cl.
*H01L 41/113* (2006.01)
(52) U.S. Cl. ...................... 310/319; 330/9; 330/174; 327/306; 327/307; 123/395; 123/52.1
(58) Field of Classification Search ................ 310/319; 330/9, 174; 327/306–307; 123/395, 52.1
See application file for complete search history.

(56) References Cited

U.S. PATENT DOCUMENTS

| | | | |
|---|---|---|---|
| 4,009,447 A | 2/1977 | Wolf et al. | |
| 4,054,111 A * | 10/1977 | Sand | 123/406.41 |
| 4,095,576 A * | 6/1978 | Hattori et al. | 123/406.66 |
| 4,962,328 A | 10/1990 | Woss et al. | |
| 5,142,236 A * | 8/1992 | Maloberti et al. | 327/337 |
| 5,371,472 A * | 12/1994 | Wohlstreicher | 330/107 |
| 6,915,780 B1 * | 7/2005 | Kashiwase et al. | 123/395 |
| 2004/0035398 A1* | 2/2004 | Klugl et al. | 123/456 |
| 2004/0075498 A1* | 4/2004 | Matsui et al. | 330/174 |
| 2005/0062514 A1* | 3/2005 | Kashiwase et al. | 327/307 |

FOREIGN PATENT DOCUMENTS

| | | |
|---|---|---|
| DE | 195 06 133 A1 | 9/1995 |
| JP | 3123798 B2 | 1/2001 |

OTHER PUBLICATIONS

European Search Report for corresponding application No. EP 04 00 6608, dated Feb. 8, 2006.

* cited by examiner

*Primary Examiner*—Darren Schuberg
*Assistant Examiner*—J. Aguirrechea
(74) *Attorney, Agent, or Firm*—Darby & Darby

(57) ABSTRACT

A positive charge of a sensor element is charged in a signal converting circuit, is converted into a positive voltage, and is outputted. When the polarity of the charge of the sensor element is inverted to the negative and an output of the signal converting circuit is decreased, the leaked charges are superimposed and become the negative. An automatic correction circuit detects the negative output and discharges the charges so as to set the input to "0". Thus, the offset of the signal level due to the charge leakage is automatically corrected.

4 Claims, 7 Drawing Sheets

AMPLIFIER CONVERTING CHARGE SIGNAL

The disclosure of Japanese Patent Application No. 2003-076130 filed on Mar. 19, 2003 including the specification, drawings and abstract is incorporated herein by reference in its entirety.

BACKGROUND OF THE INVENTION

1. Field of the Invention

The present invention relates to an amplifier for converting a charge signal which converts a charge signal outputted from a charge generating sensor into a voltage.

2. Description of the Related Art

A charge generating sensor such as a piezoelectric element generates a charge in proportional to a load magnitude which is mechanically applied. Generally, the charge generating sensor is suitable for measuring a continuous dynamic pressure and the like and is used for a pressure sensor (in-cylinder pressure sensor) or the like for measuring a combustion pressure in a cylinder. A signal from the charge generating sensor is generally converted into a voltage signal by using an amplifier with an ultra-high input impedance, thus to extract the signal from the charge generating sensor. Referring to FIG. 9, the amplifier for converting a charge signal (so-called a charge amplifier) is mainly used and has a feedback capacitor C between input and output terminals of an amplifier A0 having an infinite gain with an opposite phase (antiphase).

However, the measurement using the charge generating sensor always has a problem, namely, the leakage of charge and, the leakage amount of charges is increased when the amplifier for converting the charge signal is connected. For example, upon measuring the pressure by connecting the amplifier for converting the charge signal to a pressure sensor using a piezoelectric element, the pressure is increased from a zero level and is returned thereto. The charge of the pressure sensor becomes negative by the leakage amount of the charges. Accordingly, the fluctuation in a zero point level of the signal outputted from the amplifier for converting the charge signal disturbs an accurate measurement thereof.

A description is given of the case of the fluctuation in the zero point level due to the leakage of charges when the charge amplifier is connected to the cylinder pressure sensor having the piezoelectric element attached to an engine combustion chamber and a combustion pressure in the cylinder is measured.

In a general engine having four-stroke cycle (intake→compression→combustion→exhaust), a piston reaches approximately a top dead center (TDC). Then, when an exhaust valve is closed and an intake valve is opened, the cylinder pressure becomes an atmospheric pressure in the case of a natural aspiration engine, and it becomes a pressure obtained by adding a boost pressure (e.g., 500 to 1,500 mmHg) to the atmospheric pressure in the case of a supercharged engine.

In this case, the piezoelectric effect of the sensor element generates the charges proportional to a cylinder pressure load. Assuming that the generated charge is designated by $-q$, the charge $-q$ is charged to the feedback capacitor C of the charge amplifier. Further, the charge $-q$ is converted into a voltage signal $+V$ by the amplifier A0 and is outputted. Therefore, in the case where the signal level is at the zero level and the boost pressure is present when the cylinder pressure becomes the atmospheric pressure, the increasing level of the boost pressure, as a DC voltage component, to the zero level of the atmospheric pressure becomes the basic level of a combustion waveform which rises by a combustion pressure to be generated.

From the TDC to a bottom dead center (BDC) of the piston, the intake continues in the meantime and, the cylinder pressure is not highly changed and is maintained to approximately the basic level. Next, the piston reaches approximately the BDC, the intake valve is closed, and the compression starts from the BDC to the TDC. Simultaneously with the compression, the cylinder pressure starts to increase, the charge of the piezoelectric element is increased, and the charges are sequentially charged to the feedback capacitor C of the charge amplifier. Further, the voltage signal $+V$ converted and outputted by the amplifier A0 is increased.

An ignition generates a combustion pressure just before the piston reaches the TDC (i.e. just before the maximum value of the compression pressure), and the generation of the combustion pressure rapidly increases the charges of the piezoelectric element. Further, the voltage signal $+V$ converted and outputted by the amplifier A0 is also rapidly increased. Then, the signal outputted as the combustion pressure is at the above-mentioned basic level, that is, is the level of the atmospheric pressure in the case of the natural aspiration engine, while, it is a signal obtained by superimposing (or overlapping) to the DC voltage component of the boost pressure in the case of the supercharged engine.

After the cylinder pressure reaches the maximum level, the piston approaches the BDC from the TDC. Simultaneously therewith, the cylinder pressure changes to decrease, then, the polarity of the charges is inverted, and the charges start to feedback to the piezoelectric element. That is, upon viewing this phenomenon from the piezoelectric element side, the charge $-q$ is charged in proportional to a stress when the positive stress (compression force) acts (or is applied) to the piezoelectric element by the combustion pressure. Further, the charge $-q$ is inverted to the charge $+q$ inversely proportional to the stress when the combustion pressure is decreased and the negative stress (tension) acts to the piezoelectric element. This phenomenon inverts the polarity of the feedback capacitor C and, thus, the polarity of the output signal is inverted.

After that, the piston reaches approximately the BDC and the exhaust valve is opened (the intake valve is still closed). When the combustion gas is exhausted while the piston approaches to the TDC, the cylinder pressure of the natural aspiration engine returns to the atmospheric pressure and the cylinder pressure of the supercharged engine returns to the boost pressure. One combustion cycle ends and the signal level returns to the level before starting the combustion cycle.

An ordinate of an oscillograph denotes the signal voltage and an abscissa denotes a time or a rotational angle of a crankshaft. Then, the oscillograph draws the change in cylinder pressure during one cycle, namely, a combustion waveform. In the case of the natural aspiration engine, the pressure rises from the atmospheric pressure (signal level) and the combustion ends and, then the signal level returns to the original one. In the case of the supercharged engine, the pressure rises from the level of the boost pressure (level of the DC voltage) and the rising combustion ends and, then, the signal level is returned to the level of the original boost pressure.

However, an actual electric circuit formed by connecting the sensor to the amplifier does not really have an infinite insulation resistance. Consequently, in the combustion cycle having rapid repetitions such as that of the engine combustion, the charges are leaked at each cycle and the leaked charges are converted into the negative signal-voltage. Referring to FIG. 10, a drift DV of the signal level generates in relative to an effective combustion pressure ECP, resulting the offset of the rising point of the waveform.

In the case of waveform data including the offset of the above-mentioned signal level, under circumstances using a high speed operating device with a large capacity such as the research and development stages, the combustion waveform for one cycle is extracted and processed from the continuous combustion waveforms. Further, the combustion waveform of the atmospheric pressure or the absolute pressure is assumed and the waveform can be analyzed. However, the application to commercial mass production vehicles has various problems to be solved.

That is, mounting a system for measuring the engine combustion pressure and the combustion waveform on the commercial vehicles needs the operation and process of many offset values by using an on board device for the drift of the generated signal level so as to obtain the correct signal level. Thus, an enormous processing capacity needs to be added to the on board device and the increase in size of the device and in costs is caused.

For example, Japanese Patent Publication No. 3123798 suggests means for solving the problems, by which a filter having a threshold value of 0.01 to 1.0 Hz is connected to an output terminal of the amplifier for converting the charge signal and low-frequency components of the pressure waveform are removed so as to substantially maintain the zero level. However, according to the technology suggested in the Publication, since a high pass filter removes the low frequency components of the combustion waveform, an AC coupling is substantially used and the whole DC components of the waveform are removed. Therefore, the accurate waveform analysis further needs the correction of removed DC components and the operating load necessary for the signal processing is not reduced.

SUMMARY OF THE INVENTION

Accordingly, it is an object of the present invention to provide an amplifier for converting a charge signal which automatically corrects an offset of a signal level due to a charge leakages and which reduces an operating load necessary for the signal processing.

Briefly, in the amplifier for converting the charge signal according to the present invention, when a signal converting circuit converts a charge signal from a sensor into a voltage signal, an amount of the charge leakages generated by a signal transmission system is detected and the output level of the signal converting circuit is automatically corrected so that it has the same level at a start timing and an ending timing for generating the charges of the sensor.

DESCRIPTION OF THE PREFERRED EMBODIMENTS

Figure 1:
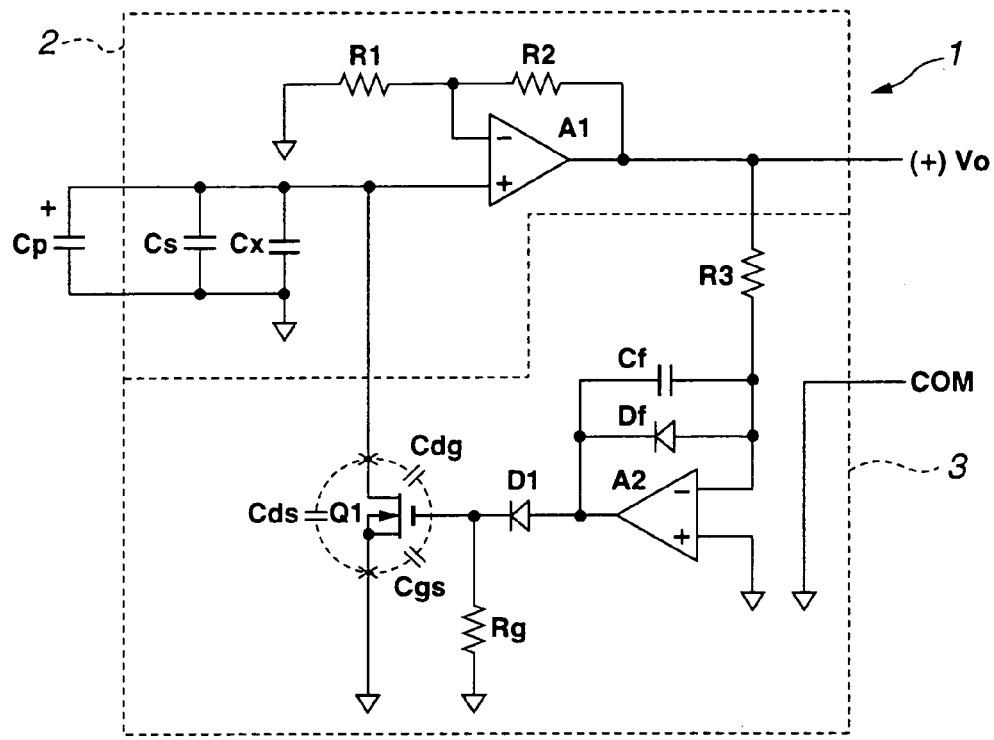
FIG. 1 is a circuit diagram showing a basic equivalent circuit of an amplifier for converting a charge signal to which a charge generating sensor is connected according to the first embodiment of the present invention.

An amplifier for converting a charge signal according to the present invention is compatible with positive and negative polarities of input charges, and is further compatible with an inverting amplifier and a normal (non-inverting) amplifier. FIG. 1 shows a basic equivalent circuit of the normal type of a positive charge input. Referring to FIG. 1, a reference numeral Cp denotes an equivalent capacitor indicating generated charges of a charge generating sensor such as a pressure sensor using a piezoelectric element, and reference numeral 1 denotes an amplifier for converting a charge signal connected to the equivalent capacitor Cp.

In the amplifier 1 for converting the charge signal, a signal converting circuit 2 using a normal amplifier A1 is connected to the equivalent capacitor Cp. Further, an automatic correction circuit 3 for an automatic correction is connected to the signal converting circuit 2 so that a negative output from the amplifier A1 is detected and an input of the amplifier A1 is "0".

The signal converting circuit 2 has the same configuration as that of a conventional amplifier for converting the charge signal. In the signal converting circuit 2, a capacitor Cx for voltage conversion is connected in parallel with the equivalent capacitor Cp which equivalently indicates the generated charges of the charge generating sensor, and the capacitor Cx for a voltage conversion is connected to a non-inverting input terminal of the amplifier A1. A resistor R1 for setting gain is inserted between an inverting input terminal of the amplifier A1 and the common ground earth, and a resistor R2 for setting a gain is inserted between the inverting input terminal of the amplifier A1 and an output terminal. The resistors R1 and R2 for setting the gain are connected to the inverting input terminal of the amplifier A1.

A capacitor Cs connected in parallel with the capacitor Cx for the voltage conversion equivalently indicates a stray capacity of a signal transmission system such as a coaxial cable for connecting the charge generating sensor and the capacitor Cx for the voltage conversion and a signal line between the capacitor Cx for voltage conversion and an input pin of the amplifier A1.

The automatic correction circuit 3 mainly comprises an inverting amplifier A2 for detecting the output from the amplifier A1 and a switch element Q1 for discharging charges of the capacitor Cx for the voltage conversion (including the equivalent capacitor Cs). The switch element Q1 includes a semiconductor switch driven by the amplifier A2, a relay switch driven by the amplifier A2. According to the first embodiment, the switch element Q1 is a field effect transistor (FET) as the semiconductor switch. Referring to FIG. 1, the switch element Q1 is an N-channel MOS FET. Hereinbelow, the switch element Q1 is described as the FET Q1.

In the amplifier A2, input terminals for non-inverting thereof are commonly connected to the ground earth, the input terminals for inverting thereof are connected to the output terminals of the amplifier A1 via a resistor R3, and the output terminals thereof are connected to a gate of the FET Q1 via a diode D1. In the FET Q1, the gate thereof is connected to a gate resistor Rg, a drain thereof is connected to the input terminal for the non-inverting of the amplifier A1, and a source thereof is commonly connected to the ground. A capacitor Cf and a diode Df are connected between the input terminal for inverting and the output terminal of the amplifier A2, and, for example, gain 100,000 to 1,000,000 is obtained.

With the above-described structure, the mechanical load is applied to a sensor element of the charge generating sensor and, then charges are generated with the (+q) polarity (positive) that is directly proportional to the magnitude of the mechanical load. The equivalent capacitor Cp of the charge generating sensor charges the capacitor Cx for the voltage conversion in the signal converting circuit 2, and the amplifier A1 converts the charges into the positive voltage and outputs it. On the other hand, the mechanical load of the sensor element changes to reduce, the polarity of charges is inverted to (−q) (negative), and the charges inversely flow from the capacitor Cx for the voltage conversion and feedback to the capacitor Cp.

Then, the following formula (1) determines a value of a voltage which is obtained by converting an output voltage VO of the amplifier A1, that is, a generated charge q of the charge generating sensor. In the formula (1), symbol Cds denotes a capacitance between the drain and the source of the FET Q1, and symbol Cdg denotes the capacitance between the drain and the gate thereof. Further, symbol Cgs shown in FIG. 1 denotes the capacitance between the gate and the source.

$$VO=(1+R2/R1)q/(Cp+Cs+Cx+Cds+Cdg) \quad (1)$$

Upon observing this phenomenon by using the output from the amplifier A1, the voltage is zero before applying the mechanical load to the sensor element, and it is positive after applying the mechanical load. Further, upon starting the decrease in load, the voltage changes to the negative. Therefore, if the charges are not leaked, the charges become zero and the output voltage of the amplifier A1 also becomes zero.

However actually, an insulation resistance is infinite in the signal transmission system such as the coaxial cable for connecting the sensor element and the capacitor Cx for the voltage conversion or the signal line from the capacitor Cx for the voltage conversion to the input pin of the amplifier A1. A part of the charges in the capacitor Cx for the voltage conversion is leaked and, when the mechanical load starts to reduce, it is superimposed to a signal voltage which changes to the negative and is outputted. Therefore, the signal voltage to be returned to the initial level at the start timing of the load reaches the negative.

The automatic correction circuit 3 detects the negative output from the amplifier A1 in the signal converting circuit 2 as the leakage of the charges. When the automatic correction circuit 3 detects the negative output, it makes the FET Q1 conductive and discharges the charge so as to set the input from the amplifier A1 to "0". As a result, the output from the amplifier A1 maintains approximately 0. When the mechanical load of the sensor element changes to increase, the FET Q1 is OFF and the output from the amplifier A1 increases.

Hereinbelow, a description is given of the operation of the automatic correction circuit 3 upon measuring the pressure by a pressure sensor using a piezoelectric element as an example.

For the purpose of a brief description, the resistors R1 and R2 for setting the gain of the amplifier A1 are set to none (∞) and a short circuit (0Ω), respectively. The gain of the amplifier A1 is 1 and the charges generated by the pressure sensor are converted into a low voltage available for the amplifier A1, by the capacitor Cx for the voltage conversion. The amplifier A1 operates as a buffer amplifier for outputting the voltage.

First, the positive pressure is applied to the pressure sensor and, when the positive charges are generated, the amplifier A1 in the signal converting circuit 2 outputs the positive voltage. On the other hand, when the charges are leaked to zero or become the negative pressure, the output of the amplifier A1 is negative. The amplifier A2 in the automatic correction circuit 3 detects the negative output from the amplifier A1 as the leakage of the charges.

As mentioned above, the amplifier A2 in the automatic correction circuit 3 outputs high gain (on the order of 100,000 to 1,000,000), inversely amplifies the negative voltage of the amplifier A1 in the signal converting circuit 2, and applies the amplified output to the gate of the FET Q1. When a gate voltage of the FET Q1 is a threshold voltage Vth (around 1V to 3V) or less, the charges are injected to the capacitor Cx for the voltage conversion via the capacitance Cdg between the drain and the gate.

Then, when the gate voltage of the FET Q1 is over the threshold voltage Vth, the conductive status starts between the drain and the source. As a result, the charges of the pressure sensor are discharged via the FET Q1 and the automatic correction functions so that the output from the amplifier A1 is set to the minimum pressure (including the negative pressure) as "0".

That is, the automatic correction circuit 3 comprising the amplifier A2 and the FET Q1 comprises one negative feedback circuit when the output is negative in view of the amplifier A1 in the signal converting circuit 2. By making the input from the amplifier A1 conductive to the zero point at the FET Q1, the automatic correction is performed and then the automatic correction circuit 3 operates so that the minimum pressure (including the negative pressure) "0" when the pressure increases.

When the automatic correction functions, the positive voltage is applied to the gate of the FET Q1. When the pressure is not continuously changed, the voltage of the FET Q1 balances at a predetermined timing and the balance state maintains. The above balance status is influenced by the voltage of various elements, the gain or the offset of the amplifier A1 and the amplifier A2, the threshold voltage Vth of the FET Q1, and a parameter such as a mutual conductance gm. However, the output from the amplifier A1 is equal to 0.

That is, the gate voltage of the FET Q1 reduces, the charges in the capacitance Cdg between the drain and gate act in the direction for decreasing the input voltage of the amplifier A1. As a result, the gate voltage is increased via the amplifier A1 and the amplifier A2. On the other hand, when the gate voltage increases, the same operation is obtained. Therefore, as long as another voltage of the amplifiers is not changed, the state maintains.

The two following factors (A) and (B) shift the above-mentioned balance state to another state. The two factors (A) and (B) shift to the other state and then the automatic correction circuit 3 stops its function.

(A) Increase in Pressure

The input of the amplifier A1 increases and then the output thereof rises, thereby reducing the output of the amplifier A2 (gate voltage of the FET Q1). Further, the pressure increases and then the output of the amplifier A2 becomes zero, thereby ending the correction by the automatic correction circuit 3. In this case, the charges in the capacitance Cdg between the drain and the gate in the FET Q1 is compensated with a part of the input, and the compensation with the input continues until the gate voltage is "0". As a result, the output of the amplifier A1 is compressed at the rising timing of the input. The compression amount is determined depending on the capacitance Cd between the drain and the gate and the threshold voltage Vth. Therefore, preferably, the low capacitance Cdg between the drain and the gate is used for the FET Q1 as the semiconductor switch.

(B) Leakage of Charges

The leakage of charges causes the positive ones. Similarly, the output of the amplifier A1 increases and the output of the amplifier A2 decreases. As a result of the leakage of charges, the balance state does not shift unless the charge of the input becomes positive.

As mentioned above, when the amplifier for converting the charge signal is connected to the charge generating sensor so as to convert the charge signal to the voltage signal, the leakage of charges in the signal transmission system is inevitable. However, the automatic correction circuit 3 detects the leakage of the charges to suppress the offset of the zero point and therefore it is possible to reduce the operation load upon processing a measuring signal with the simple circuit structure and with low costs due to the small number of parts.

Further, the rapid increase in pressure and the fall subsequent thereto are continuously repeated in, typically, the engine cylinder combustion pressure. The leakage of the charges is caused in the rapid inflow and outflow of the charges proportional to the pressure change. Both the rapid change of pressure and the leakage of charges enable the accurate combustion analysis for the offset of the signal level stored every cycle by using the offset correction of the automatic correction circuit 3. Thus, the optimum combustion control improves a fuel consumption and an exhaust emission control.

According to the present invention, the amplifier for converting the charge signal is not limited to that of the normal type of the positive charge input. The combination of the positive and negative of the input charges, the normal and inverting types of the amplifier, and the switch element enables various circuit structures as shown in FIGS. 2 to 4 as examples.

Figure 2:
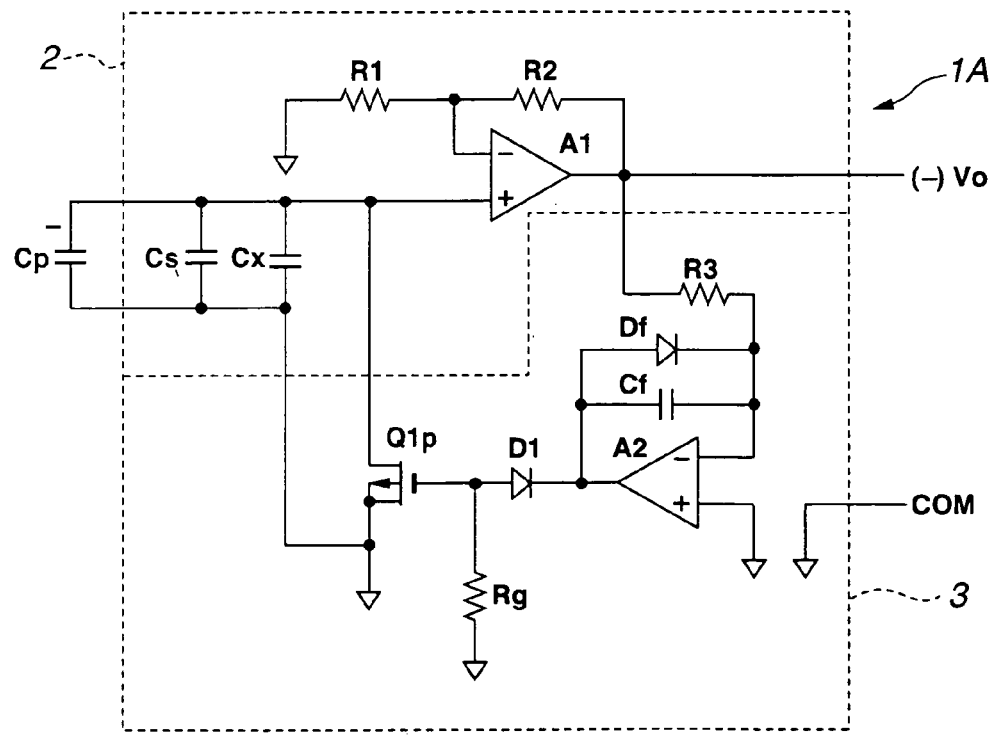
FIG. 2 is the circuit diagram showing the amplifier for converting the charge signal of a normal type of a negative charge input according to the first embodiment of the present invention.

In an amplifier 1A for converting the charge signal shown in FIG. 2, the FET Q1 in the automatic correction circuit 3 is changed to a P-channel MOS FET Q1p so that the amplifier 1 for converting the charge signal can process the negative charge input. Further, the amplifier 1A for converting the charge signal in FIG. 2 is an amplifier for converting the charge signal of the normal type of the negative charge input.

Figure 3:
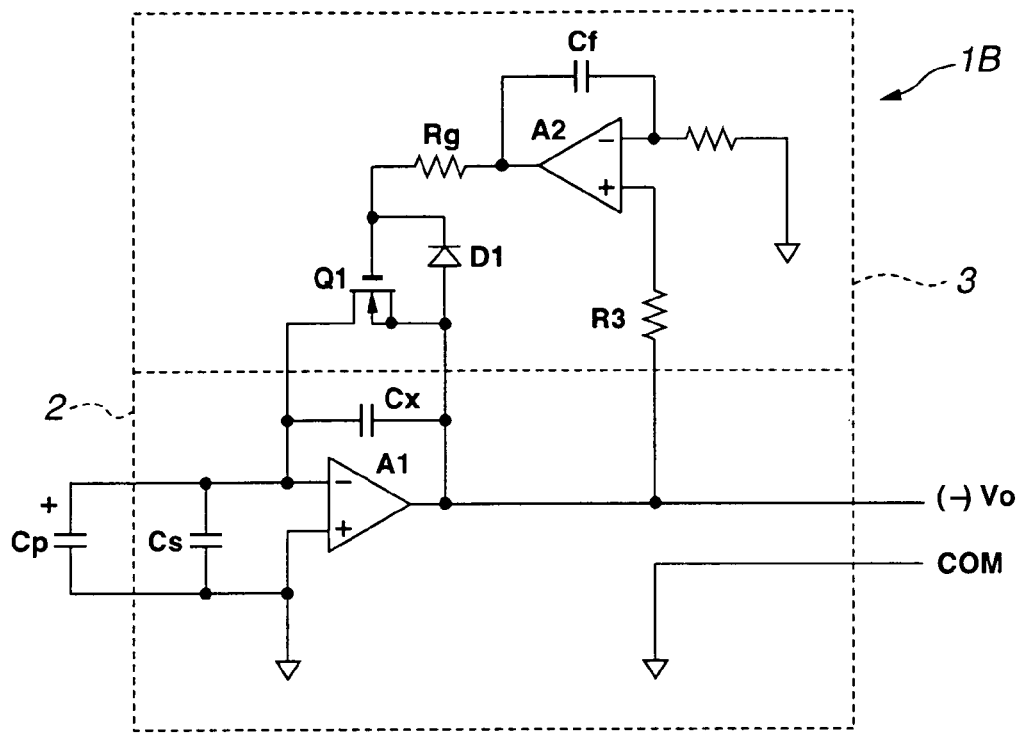
FIG. 3 is the circuit diagram showing the amplifier for converting the charge signal of the inverting type of a positive charge input according to the first embodiment of the present invention.
Figure 4:
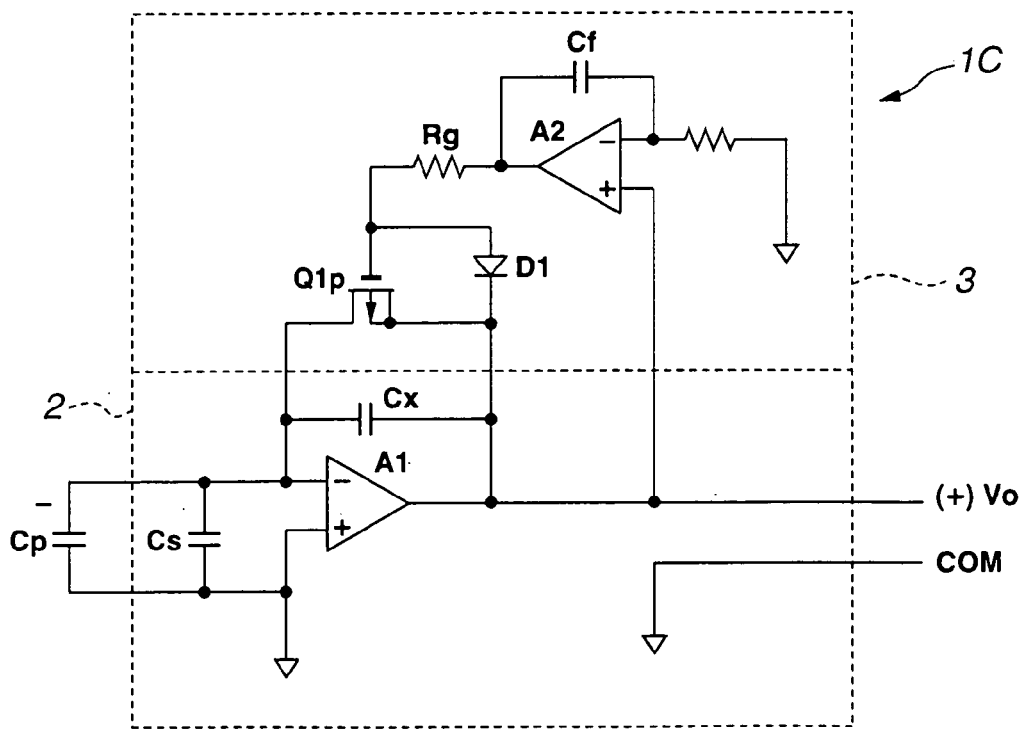
FIG. 4 is the circuit diagram showing the amplifier for converting the charge signal of the inverting type of the negative charge input according to the first embodiment of the present invention.

Amplifiers 1B and 1C for converting the charge signal shown in FIGS. 3 and 4 use the amplifier A1 in the signal converting circuit 2 as an inverting amplifier. The amplifier 1B for converting the charge signal shown in FIG. 3 corresponds to the input of positive charge, the amplifier 1C for converting the charge signal shown in FIG. 4 corresponds to the input of negative charge.

That is, in the amplifier 1B for converting the charge signal shown in FIG. 3, the capacitor Cx for voltage conversion is connected between the inverting input and the output of the amplifier A1, a drain and a source in an N-channel MOS FET Q1 are connected, and the output of the amplifier A1 is connected to the non-inverting input side of the amplifier A2. The amplifier 1C for converting the charge signal shown in FIG. 4 can process the negative charge input by changing the N-channel MOS FET Q1 to the P-channel MOS FET Q1p, as compared with the amplifier 1B for converting the charge signal shown in FIG. 3.

The basic operation is as mentioned in the circuit structures. The leakage of the charges is detected, the offset at the zero point is automatically corrected and the operation load upon processing the measuring signal is reduced.

The following formula (2) determines a value of a voltage which is obtained by changing the output voltage VO in the case of using the inverting amplifier A2, that is, the charge q generated by the sensor. In the case of using the inverting amplifier A2, the stray capacity (equivalent capacitor Cs) does not affect but positive and negative power sources are necessary as an amplifier power source.

$$VO = -q/(Cx + Cds + Cdg) \qquad (2)$$

Figure 5:
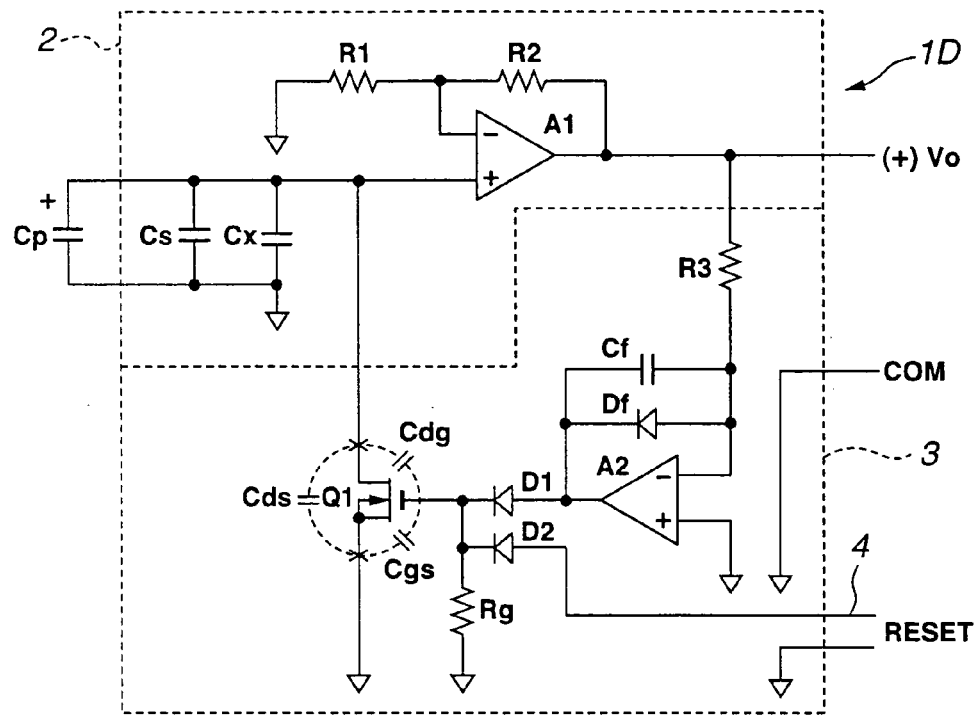
FIG. 5 is the circuit diagram showing the amplifier for converting the charge signal having a reset circuit using a semiconductor switch according to the second embodiment of the present invention.
Figure 6:
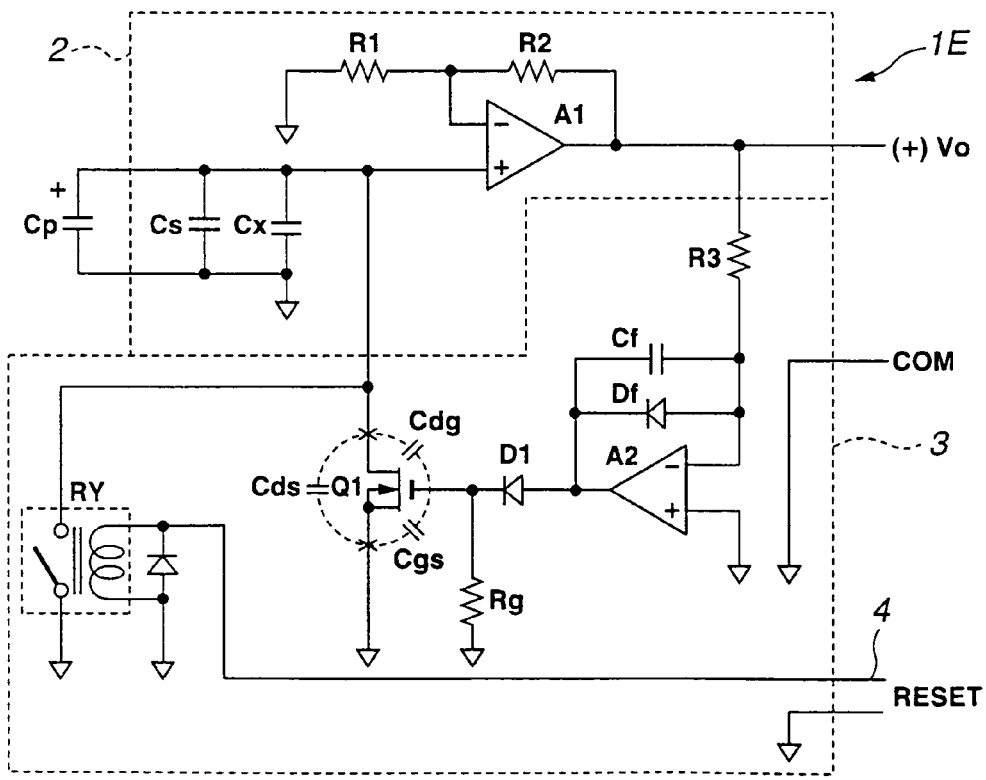
FIG. 6 is the circuit diagram showing the amplifier for converting the charge signal having the reset circuit using a mechanical switch according to the second embodiment of the present invention.
Figure 7:
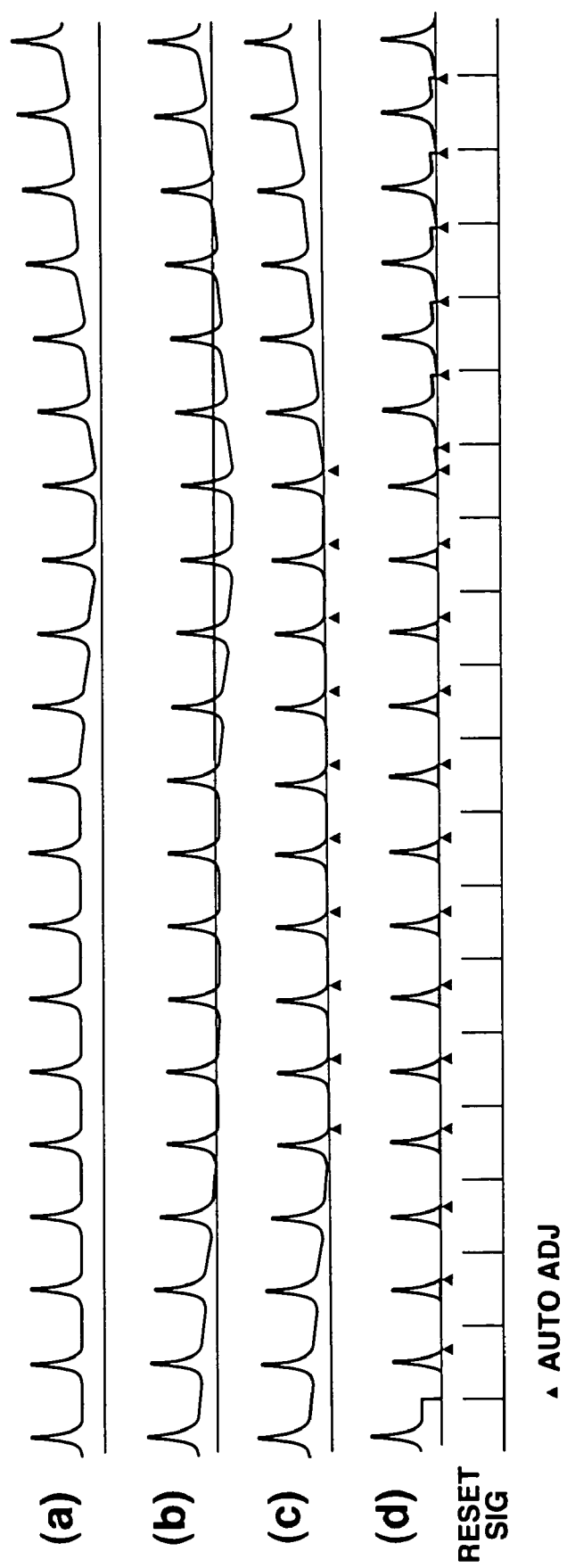
FIG. 7 is an explanatory diagram showing a relationship among an automatic correction, a synchronous reset, and pressure waveforms according to the second embodiment of the present invention.

Next, the second embodiment of the present invention will be described. FIGS. 5 to 7 relate to the second embodiment of the present invention, FIG. 5 is the circuit diagram showing the amplifier for converting the charge signal having a reset circuit using the semiconductor switch, FIG. 6 is the circuit diagram showing the amplifier for converting the charge signal having the reset circuit using the mechanical switch, and FIG. 7 is the explanatory diagram showing the relationship among the pressure waveform, the automatic correction, and the synchronous reset.

In the case that the measurement is performed by connecting the amplifier for converting the charge signal to the charge generating sensor under frequently temperature changing circumstances, for example, the measurement for the combustion pressure in the engine cylinder with the pressure sensor using the piezoelectric element, the change in temperature is superimposed as the output and it seems that the pressure signal is set on the DC voltage. Therefore, according to the second embodiment, the reset circuit for discharging the input charge of the signal converting circuit 2 by the external signal is added so as to remove the DC voltage by the temperature as compared with the first embodiment.

The amplifier 1D for converting the charge signal shown in FIG. 5 realizes the cooperation operation with the automatic correction function and the reset function in the circuit structure of the amplifier 1 for converting the charge signal shown in FIG. 1. Thus, a part of the automatic correction circuit 3 functions as the reset circuit. That is, a reset signal line 4 for applying an external reset signal via a diode D2 is connected to the gate of the FET Q1, thereby forming the reset circuit using a semiconductor switch.

In the amplifier for converting the charge signal with the circuit structures shown in FIGS. 2 to 4, a reset signal line is added to the gate of the FET Q1 and, thus, a part of the automatic correction circuit 3 functions as the reset circuit.

In the amplifier 1D for converting the charge signal in which the automatic correction circuit 3 commonly functions as the reset circuit, the operation of the signal converting circuit 2 and the automatic correction circuit 3 is the same as that according to the first embodiment. However, by forcedly applying the reset signal with a voltage higher than the threshold voltage Vth from the outside to the gate of the FET Q1, the FET Q1 is made conductive. As a result, the charges are discharged irrespective of the input state of the sensor signal and the input of the amplifier A1 becomes zero.

When the reset signal is absent, the gate voltage directs to zero by a gate resistor Rg. Therefore, the charges in the capacitance Cdg between the drain and the gate are transmitted to the capacitor Cx for voltage conversion in the case of the threshold voltage Vth or less, and the input of the amplifier A1 directs in the negative direction. The input voltage of the amplifier A1 in this case is a following formula, $(-Vth \cdot Cdg/(Cs+Cx+Cdg+Cds))$, and the voltage is sufficient to operate the automatic correction circuit 3. Thus, the automatic correction circuit 3 operates. Therefore, irrespective of the input, the automatic correction circuit 3 operates while the input is zero at this timing. When the pressure decreases, the automatic correction circuit 3 operates while the input is zero at the lowest pressure point.

An amplifier 1E for converting the charge signal shown in FIG. 6 has a reset circuit independent of the automatic correction circuit 3, and forms the reset circuit by using a mechanical switch. That is, a normally opened contact of a relay RY is connected and is commonly connected to the ground on the input side of the amplifier A1 in the amplifier 1 for converting the charge signal shown in FIG. 1. Thus, a discharge path is formed in parallel with the FET Q1 of the automatic correction circuit 3, and the reset signal line 4 for driving the coil of the relay RY is arranged.

The coil of the relay RY is driven by the external reset signal, a relay contact is closed, and the charges are discharged. Thus, the input of the amplifier A1 is "0" irrespective of the input state of the sensor signal. The reset circuit using the mechanical switch can be also applied to the amplifier for converting the charge signal shown in FIGS. 2 to 4.

The above-mentioned reset signal is applied synchronously with the measurement target, thereby enabling the precise measurement. For example, in the case of measuring the combustion pressure in the engine cylinder, the sensor signal includes the output due to the temperature and only the pressure is not separated. The reset operation enables the temporary removal of the temperature. However, the temperature rapidly changes. Therefore, the reset operation is performed synchronously with a crankshaft rotational angle every cycle or several cycles and thus the output due to the temperature is removed and an output error due to the temperature change is reduced.

FIGS. 7A to 7D show examples of the output signal as a result of connecting, to the pressure sensor comprising the piezoelectric element, the amplifier for converting the charge signal having the automatic correction function with the reset function according to the second embodiment. Referring to FIG. 7A, when the pressure rapidly increases and the subsequent fall continues at a periodic interval, a line of the lowest pressure shifts at the constant level. Referring to FIG. 7B, in the conventional amplifier for converting the charge signal, the leakage of the charges in the signal transmission system drifts the zero point of the amplifier output and the offset starts from the basic level. However, referring to FIG. 7C, in the amplifier for converting the charge signal according to the present invention, the automatic correction corrects and maintains the zero point to the basic point. Further, referring to FIG. 7D, the reset signal is inputted synchronously with the period of the pressure change, thereby correcting the drift due to the temperature change which is not fully corrected by the automatic correction.

Figure 8:
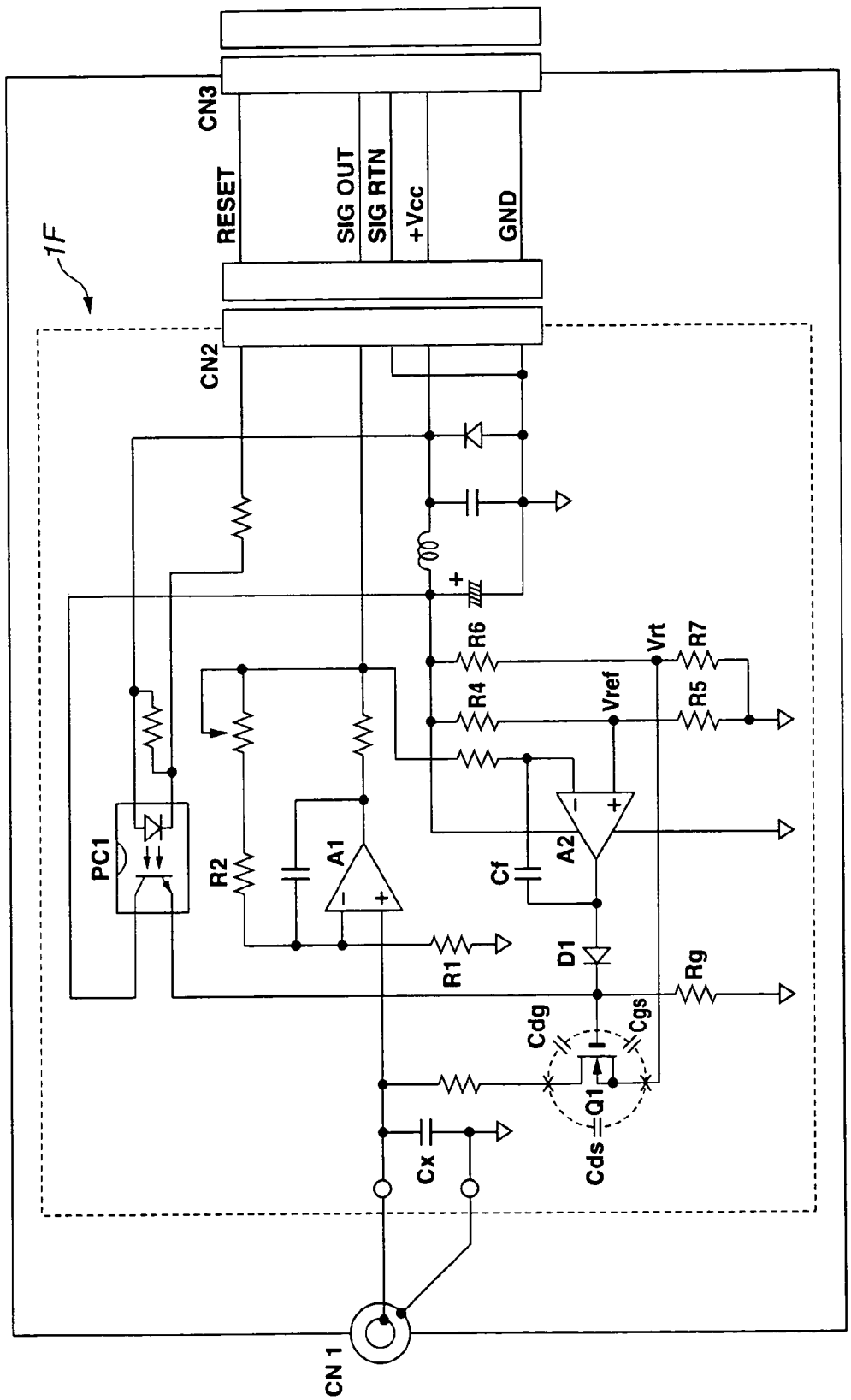
FIG. 8 is the circuit diagram showing the amplifier for converting the charge signal of a single power source operation type according to the third embodiment of the present invention.
Figure 9:
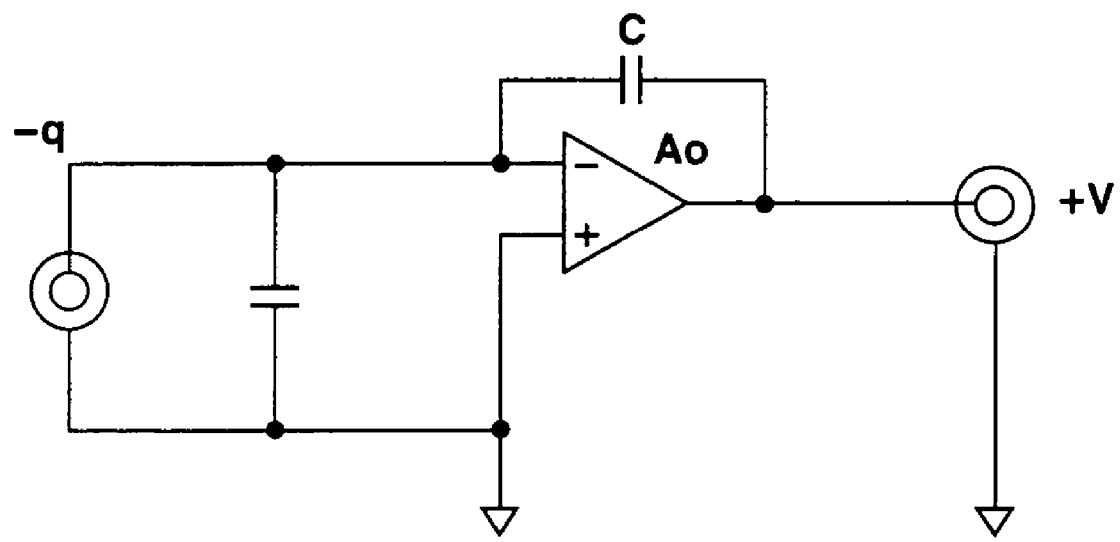
FIG. 9 is the circuit diagram showing the charge amplifier according to a conventional prior art.
Figure 10:
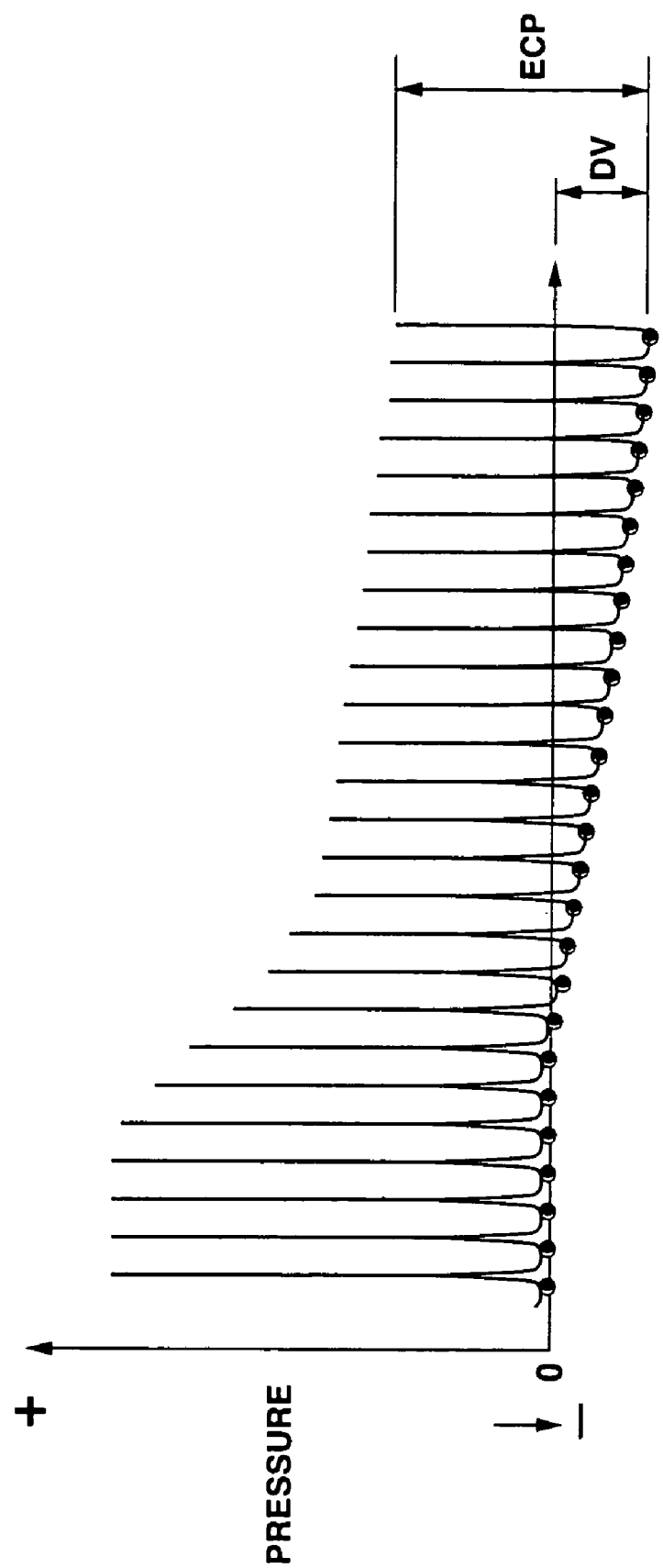
FIG. 10 is the explanatory diagram showing an offset of the signal level due to a charge leakage according to the conventional prior art.

Next, the third embodiment of the present invention will be described. FIG. 8 is the circuit diagram showing the amplifier for converting the charge signal of the single power source operation according to the third embodiment of the present invention.

According to the third embodiment, the amplifier for converting the charge signal which operates by the single power source is applied to an on board device. With the structure of the amplifier for converting the charge signal of the single power source, the negative voltage is not used and a reference voltage as the "0" amplifier output is generated by dividing a power source voltage.

In the circuit example shown in FIG. 8, the amplifier 1 for converting the charge signal as the basic structure shown in FIG. 1 is replaced and an amplifier 1F for converting the charge signal is used so that it is operated by the single power source of the on board power source. The amplifier 1F for converting the charge signal is connected to the capacitor Cx for voltage conversion so that the charges generated by the charge generating sensor such as the cylinder pressure sensor are charged to the capacitor Cx for voltage conversion via a connector CN1. A signal is outputted to a control device (not shown) and a reset signal is inputted to it via connectors CN2 and CN3 and circuit power source is supplied.

The amplifier 1F for converting the charge signal operated by the single power source performs the basic operation which is mentioned above. However, on the circuit structure by the single power source, a power source voltage Vcc (e.g., +DC5V) is divided by resistors R4 and R5 and a reference voltage Vref corresponding to "0" (e.g., +2 mV) is generated. Thus, the reference voltage Vref is applied to the non-inverting input terminal of the amplifier A2. The amplifier A2 sets the reference voltage Vref to "0", and uses a voltage lower than the reference voltage Vref and a higher voltage than it as the negative and the positive, respectively.

In the amplifier 1F for converting the charge signal operated by the single power source, the gate of the FET Q1 is connected to a potential point which determines the input voltage of the amplifier A1. The potential point is set to a voltage Vrt (e.g., +6 mV) obtained by dividing the power source voltage Vcc by resistors R6 and R7, and is adjusted depending on the application.

A signal for forced reset is applied to the gate of the FET Q1 via a gate resistor Rg from a photocoupler PC1 for improving the noiseproof. The reset signal makes the FET Q1 conductive, thus to set the input of the amplifier to the voltage Vrt. Further, the output is obtained by multiplying the voltage Vrt to the gain of the amplifier A1.

When the reset signal is absent, the charges in the capacitance Cdg between the drain and the gate of the FET Q1 are discharged and the input of the amplifier A1 is decreased corresponding to the discharge operation. A result, the amplifier 1F continuously operates when the output of the amplifier A1 is the reference voltage Vref or more and the automatic correction is performed when the output of the amplifier A1 is lower than the reference voltage Vref.

As mentioned above, according to the present invention, upon converting, into the voltage signal, the charge signal from the sensor for generating the charges caused by the effect of the detecting target and outputting it, the offset of the signal level due to the leakage of the charges generated in the signal transmission system is automatically corrected. The operation load required by the signal processing is reduced.

According to the present invention, various embodiments can obviously be realized without departing from the spirits and the scopes of the present invention. The present invention is not limited to any specific embodiments except for the appended claims.

What is claimed is:

1. An amplifier for converting a charge signal, comprising:
   a signal converting circuit for converting a charge signal from a sensor by an effect of a detecting target and by a converted signal into a voltage signal; and
   an automatic correction circuit including an amplifier circuit for detecting a leakage of the charges generated in a signal transmission system by an output level of the signal converting circuit, and including a switch which is actuated by an output of the amplifier circuit, the switch being conducted by an output of the amplifier circuit when the leakage of the charges is detected by the amplifier circuit to discharge an input charge of the signal converting circuit, thereby automatically correcting an output level of said signal converting circuit so that the output levels are the same at the start timing and the end timing for generating the charges of said sensor.

2. The amplifier for converting a charge signal according to claim 1, further comprising:
   a reset circuit for discharging an input charge by an external signal.

3. The amplifier for converting a charge signal according to claim 2, wherein:
   the sensor is a cylinder pressure sensor for detecting a combustion pressure in an engine cylinder.

4. The amplifier for converting a charge signal according to claim 3, wherein:
   the external signal is synchronous with a rotational angle of a crankshaft of the engine and the input charge of said signal converting circuit is discharged at each predetermined combustion cycle.

* * * * *